US011513732B2

(12) United States Patent
Kukla

(10) Patent No.: US 11,513,732 B2
(45) Date of Patent: Nov. 29, 2022

(54) FAST DATA COMPRESSION FOR SYSTEMS WITH LARGE DYNAMIC RANGES OR OTHER SYSTEMS

(71) Applicant: Raytheon Company, Waltham, MA (US)

(72) Inventor: Amanda K. Kukla, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 300 days.

(21) Appl. No.: 16/992,985

(22) Filed: Aug. 13, 2020

(65) Prior Publication Data

US 2022/0050598 A1 Feb. 17, 2022

(51) Int. Cl.
*G06F 7/00* (2006.01)
*G06F 3/06* (2006.01)
*H03M 7/30* (2006.01)

(52) U.S. Cl.
CPC .......... *G06F 3/0659* (2013.01); *G06F 3/0673* (2013.01); *H03M 7/30* (2013.01); *G06F 3/0608* (2013.01); *G06F 2211/007* (2013.01)

(58) Field of Classification Search
CPC ...... G06F 3/0659; G06F 3/0673; H03M 7/30; G01S 7/2922; G01S 7/32; G01S 13/282
See application file for complete search history.

(56) References Cited

U.S. PATENT DOCUMENTS

| | | | |
|---|---|---|---|
| 5,282,031 A | 1/1994 | Kim | |
| 8,305,261 B2 | 11/2012 | Hunter | |
| 9,841,592 B2 | 12/2017 | Reed | |
| 10,104,314 B2 | 10/2018 | Southerland et al. | |
| 10,302,740 B2 * | 5/2019 | Fuchs | .............. G01S 13/282 |
| 2013/0011061 A1 | 1/2013 | Pan et al. | |
| 2013/0084003 A1 | 4/2013 | Crandall et al. | |
| 2016/0295234 A1 | 10/2016 | Mammou et al. | |

FOREIGN PATENT DOCUMENTS

| | | |
|---|---|---|
| CN | 102895001 A | 1/2013 |
| CN | 104378614 A | 2/2015 |
| CN | 110392260 A | 10/2019 |
| EP | 3171594 A1 | 5/2017 |
| JP | H09200741 A | 7/1997 |
| WO | 2009096276 A1 | 8/2009 |
| WO | 2015055133 A1 | 4/2015 |
| WO | 2019230442 A1 | 12/2019 |

OTHER PUBLICATIONS

U.S. Appl. No. 16/592,509 entitled "Method to Compress Range Doppler Map (RDM) Values from Floating Point to Decibels (DB)", filed Oct. 3, 2019, 41 pages.

* cited by examiner

*Primary Examiner* — Joseph J Lauture

(57) ABSTRACT

A method includes defining a lookup table having multiple compressed data values and, for each compressed data value, a range of one or more raw data values associated with the compressed data value. The method also includes compressing raw data using the lookup table. Each raw data value is associated with one of the compressed data values in the lookup table based on a distance ratio involving (i) a distance of the raw data value from a minimum value and (ii) a distance of the raw data value from a maximum value.

20 Claims, 5 Drawing Sheets

FAST DATA COMPRESSION FOR SYSTEMS WITH LARGE DYNAMIC RANGES OR OTHER SYSTEMS

TECHNICAL FIELD

This disclosure relates generally to compression systems. More specifically, this disclosure relates to fast data compression for systems with large dynamic ranges or other systems.

BACKGROUND

Various radar, imaging, or other systems generate range Doppler maps (RDMs) or other types of information that might need to be compressed. A range Doppler map can be generated by processing measurements of received signals from a scene in order to group the received signals into range bins and Doppler bins. The range bins refer to different distances from a radar or imaging system, and Doppler bins refer to different velocities (frequencies). Range Doppler maps can be produced by a number of devices and used in a number of applications.

SUMMARY

This disclosure provides fast data compression for systems with large dynamic ranges or other systems.

In a first embodiment, a method includes defining a lookup table having multiple compressed data values and, for each compressed data value, a range of one or more raw data values associated with the compressed data value. The method also includes compressing raw data using the lookup table. Each raw data value is associated with one of the compressed data values in the lookup table based on a distance ratio involving (i) a distance of the raw data value from a minimum value and (ii) a distance of the raw data value from a maximum value.

In a second embodiment, an apparatus includes at least one memory configured to store a lookup table having multiple compressed data values and, for each compressed data value, a range of one or more raw data values associated with the compressed data value. The apparatus also includes at least one processor configured to compress raw data using the lookup table. Each raw data value is associated with one of the compressed data values in the lookup table based on a distance ratio involving (i) a distance of the raw data value from a minimum value and (ii) a distance of the raw data value from a maximum value.

In a third embodiment, a non-transitory computer readable medium contains instructions that when executed cause at least one processor to access a lookup table having multiple compressed data values and, for each compressed data value, a range of one or more raw data values associated with the compressed data value. The medium also contains instructions that when executed cause the at least one processor to compress raw data using the lookup table. Each raw data value is associated with one of the compressed data values in the lookup table based on a distance ratio involving (i) a distance of the raw data value from a minimum value and (ii) a distance of the raw data value from a maximum value.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
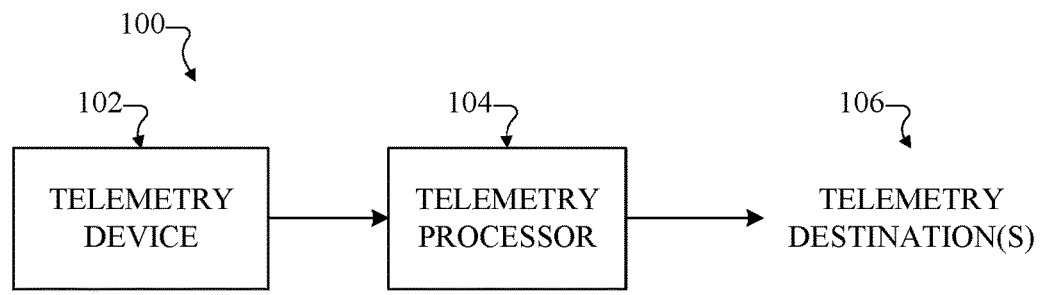
FIG. 1 illustrates an example system with large dynamic range supporting fast data compression in accordance with this disclosure.

FIGS. 1 through 5B, described below, and the various embodiments used to describe the principles of the present disclosure are by way of illustration only and should not be construed in any way to limit the scope of the disclosure. Those skilled in the art will understand that the principles of the present disclosure may be implemented in any type of suitably arranged device or system.

As noted above, various radar, imaging, or other systems generate range Doppler maps (RDMs) or other types of information that might need to be compressed. A range Doppler map can be generated by processing measurements of received signals from a scene in order to group the received signals into range bins and Doppler bins.

The range bins refer to different distances from a radar or imaging system, and Doppler bins refer to different velocities (frequencies). Range Doppler maps can be produced by a number of devices and used in a number of applications. Unfortunately, range Doppler maps can be quite large in size and may therefore represent a large amount of data. As a result, data compression may be used to reduce the storage or transmission requirements for the range Doppler maps. This may be useful in various applications, such as packetized telemetry or other applications that have restrictions on bandwidth. However, range Doppler maps can also have large dynamic ranges. In some cases, both large and small signal values are of the greatest interest, while signal values in between may be of less interest. Some approaches for data compression can minimize errors for small signal values but induce large errors on decompression for large signal values.

This disclosure provides fast data compression for various systems, including those with large dynamic ranges. As a particular example, the fast data compression can be used with systems that generate, transmit, or store range Doppler maps. As described in more detail below, data compression techniques can reduce or minimize errors for both smaller signal values and larger signal values in range Doppler maps or other raw data being compressed. As a result, these techniques can help to preserve more important information in multiple portions of the raw data being compressed. For instance, this may allow smaller signal values (such as those related to thermal noise) and larger signal values (such as those related to a target being illuminated) to be recovered from compressed data with fewer errors. Also, in some embodiments, the data compression techniques can support the use of various desired compression ratios, such as a compression ratio of 4:1 or larger. Further, since the data compression techniques can be used in systems with large dynamic ranges, these systems can generate larger amounts of raw data for use while reducing or minimizing losses in multiple signals of interest. Moreover, the data compression techniques can operate very quickly and can be implemented in any suitable manner (such as by using hardware or hardware and software/firmware). Among other things, this may allow the data compression techniques to be used in a real-time system with little or no impact on timing. In addition, these approaches may help to prioritize the reconstruction of raw data when decompressing data, rather than prioritizing visual preservation of the data (which may be done in some compression approaches involving telemetry data).

FIG. 1 illustrates an example system 100 with large dynamic range supporting fast data compression in accordance with this disclosure. As shown in FIG. 1, the system 100 includes a telemetry device 102 and a telemetry processor 104. The telemetry device 102 represents a device or system configured to generate data in the form of range Doppler maps or other telemetry data. For example, the telemetry device 102 may include or be coupled to multiple sensors that can process illumination reflected or otherwise received from a scene in order to identify telemetry-related data. In some embodiments, the telemetry device 102 may represent a radar that is used on the ground, in the air, on the water, or in space. Specific examples of systems that may use or include the telemetry device 102 can include a ground-based radar installation, an aircraft, a missile, a rocket, a drone, a satellite, and a ship. Other non-radar-based applications may also use a telemetry device 102, such as when the telemetry device 102 is used in a medical imaging system.

The telemetry processor 104 processes data generated by the telemetry device 102 in order to compress the data, such as for storage in or transmission to one or more destinations 106. For example, the compressed data may be transmitted over a wired or wireless communication link to a receiving device or station, which can decompress and use the data in any suitable manner. The telemetry processor 104 may also or alternatively store the compressed data for later decompression and use. Note that telemetry data may be used for numerous purposes, and this disclosure is not limited to any particular use of the data.

As described in more detail below, the telemetry processor 104 supports a data compression technique in which values of raw data can be mapped to a smaller set of compressed values. The mapping can be at least partially generated ahead of time and stored in a lookup table or other data structure. The mapping can then be used by suitable hardware or hardware and software/firmware, which facilitates fast compression of data like range Doppler maps. Also, the mapping of the raw data to the compressed values can be structured to help reduce or minimize errors during decompression in specific subranges of the raw data values, which can (among other things) reduce or minimize errors for both smaller signal values and larger signal values in range Doppler maps. The data compression technique can still allow an acceptable error rate to be obtained in one or more other subranges of the raw data values. Further, the data compression technique supports the use of a fixed compression ratio, which can be based on the number of bits in the compressed data values (meaning less bits require a smaller lookup table). Moreover, in some cases, the range of raw data values actually being compressed can be compared against the maximum range of data values, and this information can be used to remap the range of raw data values actually being compressed across a larger range of compressed values. This can help to further reduce errors in the recovery of one or more subranges of the raw data values during decompression. In addition, this helps to reduce the amount of telemetry data being stored or transmitted while helping to preserve desired telemetry data.

Although FIG. 1 illustrates one example of a system 100 with large dynamic range supporting fast data compression, various changes may be made to FIG. 1. For example, the telemetry processor 104 may be coupled to or otherwise used with multiple telemetry devices 102. Also, the functionality of the telemetry processor 104 may be incorporated into the telemetry device 102. In addition, the data compression technique described in this disclosure may be used in any other suitable system.

Figure 2:
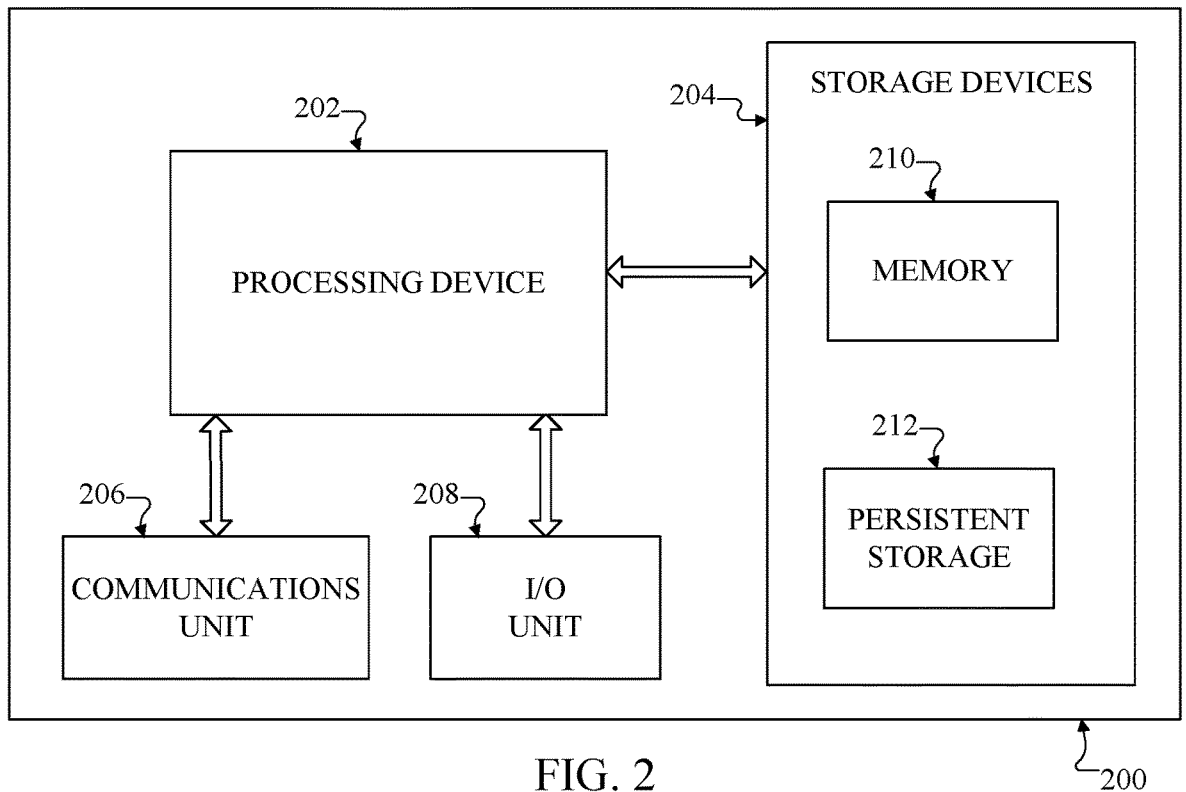
FIG. 2 illustrates an example device supporting fast data compression for a system with large dynamic range or other system in accordance with this disclosure.

FIG. 2 illustrates an example device 200 supporting fast data compression for a system with large dynamic range or other system in accordance with this disclosure. One or more instances of the device 200 may, for example, be used to at least partially implement the functionality of the telemetry processor 104 of FIG. 1. However, the functionality of the telemetry processor 104 may be implemented in any other suitable manner.

As shown in FIG. 2, the device 200 denotes a computing device or system that includes at least one processing device 202, at least one storage device 204, at least one communications unit 206, and at least one input/output (I/O) unit 208. The processing device(s) 202 may execute instructions that can be loaded into at least one memory 210. The one or more processing devices 202 include any suitable number(s) and type(s) of processors or other processing devices in any suitable arrangement. Example types of processing devices 202 include one or more microprocessors, microcontrollers, digital signal processors (DSPs), application specific integrated circuits (ASICs), field programmable gate arrays (FPGAs), or discrete circuitry.

The memory 210 and a persistent storage 212 are examples of storage devices 204, which represent any structure(s) capable of storing and facilitating retrieval of information (such as data, program code, and/or other suitable information on a temporary or permanent basis). The memory 210 may represent a random access memory or any other suitable volatile or non-volatile storage device(s). The persistent storage 212 may contain one or more components or devices supporting longer-term storage of data, such as a read only memory, hard drive, Flash memory, or optical disc.

The communications unit 206 supports communications with other systems or devices, such as the telemetry device 102 and the one or more destinations 106. For example, the communications unit 206 can include a network interface card or a wireless transceiver facilitating communications over a wired or wireless network or other communication link(s). The communications unit 206 may support communications through any suitable physical or wireless communication link(s).

The I/O unit 208 allows for input and output of data. For example, the I/O unit 208 may provide a connection for user input through a keyboard, mouse, keypad, touchscreen, or other suitable input device. The I/O unit 208 may also send output to a display or other suitable output device. Note, however, that the I/O unit 208 may be omitted if the device 200 does not require local I/O, such as when the device 200 represents a server or other device that can be accessed remotely.

In some embodiments, the instructions executed by the processing device 202 include instructions that implement the functionality of the telemetry processor 104. Thus, for example, the instructions executed by the processing device 202 may cause the device 200 to obtain and compress telemetry data. Note that the same or similar structure may also be used at each of one or more destinations 106 or other devices, where the instructions executed by the processing device 202 may cause the device 200 to decompress the compressed telemetry data.

Although FIG. 2 illustrates one example of a device 200 supporting fast data compression for a system with large dynamic range or other system, various changes may be made to FIG. 2. For example, computing and processing devices and systems come in a wide variety of configurations, and FIG. 2 does not limit this disclosure to any particular computing or processing device or system.

Figure 3:
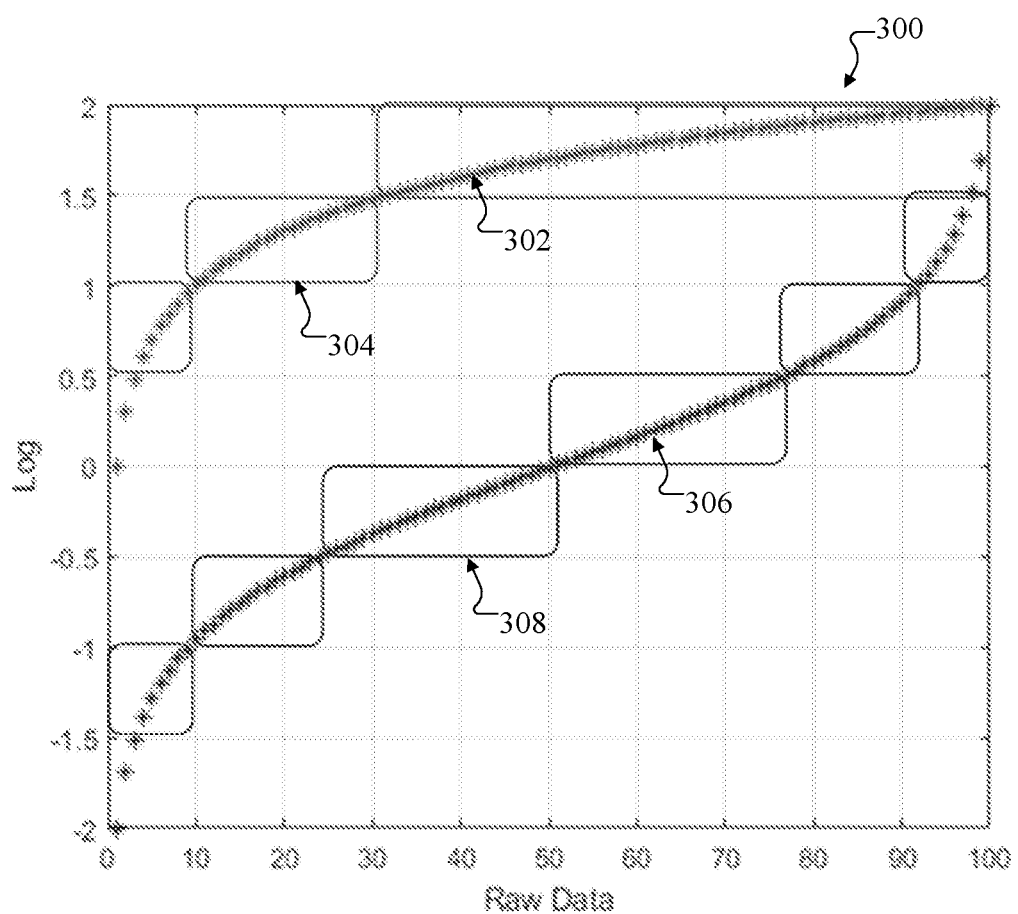
FIG. 3 illustrates different example encodings of raw data being compressed into different compressed values in accordance with this disclosure.

FIG. 3 illustrates different example encodings of raw data being compressed into different compressed values in accordance with this disclosure. In particular, FIG. 3 illustrates an example graph 300 in which a line 302 represents raw data that is compressed by applying a logarithm ($\log_{10}$) to the raw data values. Various bins 304 are also defined, where different bins 304 represent different compressed values. The raw data is compressed by applying the logarithm to the raw data values and using the bins 304 in which the logarithmic values reside as the compressed values for the raw data. However, as can be seen here, the logarithmic values get closer together as the raw data values increase. Thus, attempting to define bins 304 that represent different compressed values causes (i) the bin 304 at the lowest end of the raw data value range to encompass a smaller number of raw data values and (ii) the bin 304 at the higher end of the raw data value range to encompass a much large number of raw data values. While this is beneficial for the smaller values in the raw data, it translates into larger errors when decompressing the larger compressed values, since more raw data values are represented by the larger compressed values.

A line 306 represents raw data that is compressed by applying the same logarithm to a specific ratio for each raw data value. The ratio used here represents a ratio involving (i) the distance of the raw data value from a minimum data value and (ii) the distance of the raw data value from a maximum data value. The minimum data value represents the smallest value that might be or that is contained in the raw data, and the maximum data value represents the largest value that might be or that is contained in the raw data. The minimum and maximum data values that conceivably might be contained in the raw data are typically set by the hardware, software, or firmware generating or providing the raw data. In some embodiments, the ratio that is used can be defined as follows:

$$\text{Ratio} = \frac{Datavalue}{(MaxValue - Datavalue)} \quad (1)$$

Here, DataValue represents a raw data value being compressed, and MaxValue represents the maximum data value that the raw data might or does contain. It is assumed here that zero is the smallest data value possible in the raw data, so the numerator in Equation (1) represents the distance of the raw data value from the minimum data value, and the denominator in Equation (1) represents the distance of the raw data value from the maximum data value. Note that if a non-zero minimum value is used in the raw data, the ratio can be expressed as:

$$\text{Ratio} = \frac{(DataValue - MinValue)}{(MaxValue - DataValue)} \quad (2)$$

Here, MinValue represents the minimum data value that the raw data might or does contain.

This type of ratio changes the logarithmic curve as shown in FIG. 3, giving the line 306 more of an "S" shape. Moreover, the bins 308 at both the lower end and the higher end of the raw data value range encompass smaller numbers of raw data values, while other bins 308 still encompass larger numbers of raw data values. Thus, the compressed values represented by the bins 308 at both the lower end and the higher end of the raw data value range may represent fewer raw data values. This translates into smaller errors at both the lower and upper ends of the raw data value range during decompression, which can be useful in various applications (such as when the smaller and higher raw data value ranges are more important for analysis). The following describes how data compression based on a logarithm of a distance ratio may be implemented using this approach in order to compress range Doppler maps or other data.

Although FIG. 3 illustrates one example of different encodings of raw data being compressed into different compressed values, various changes may be made to FIG. 3. For example, the ranges of raw data values and compressed data values and the lines illustrating the different encodings can vary based on the data being compressed and the specific equations being used to compress the data.

Figure 4:
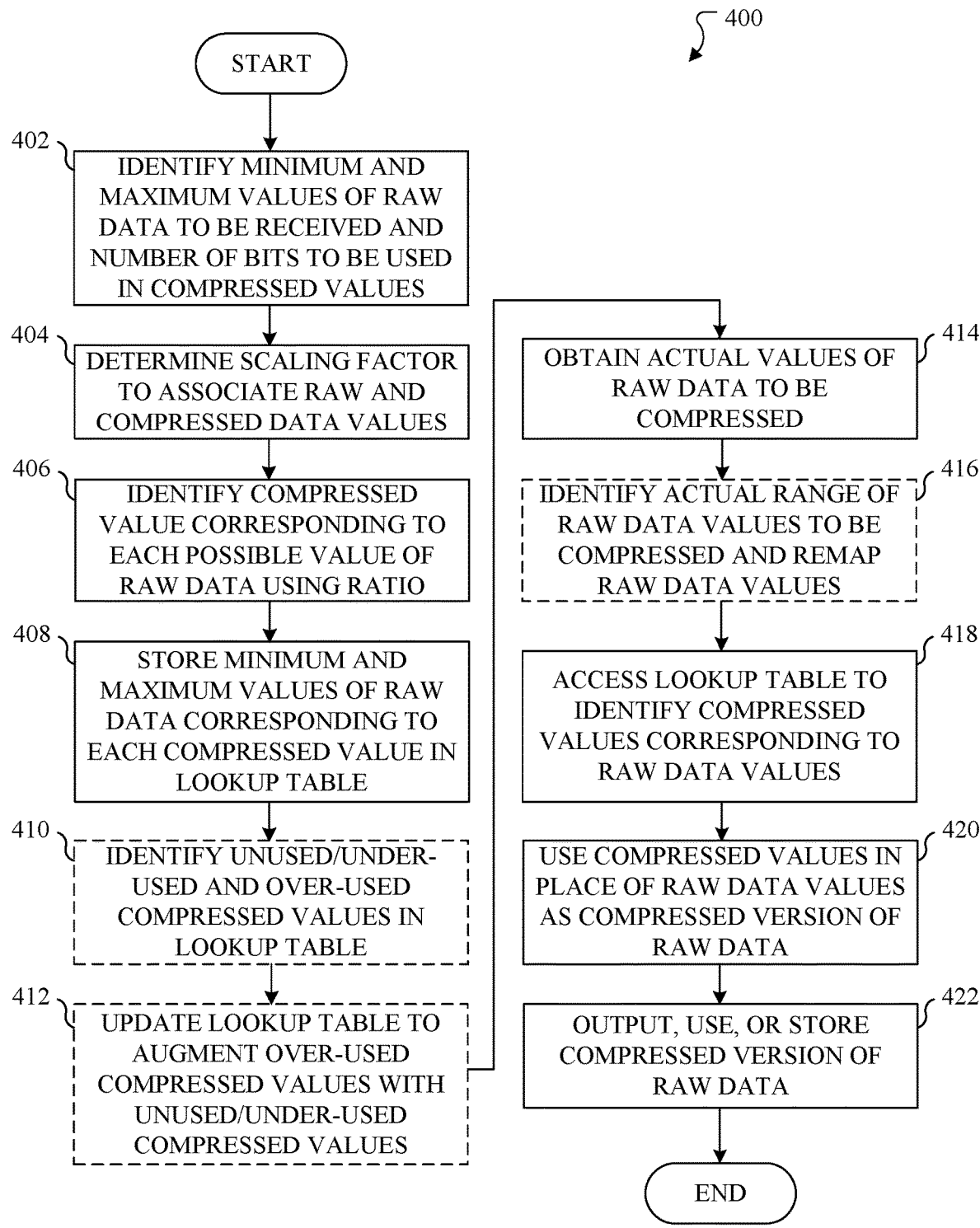
FIG. 4 illustrates an example method for fast data compression for a system with large dynamic range or other system in accordance with this disclosure.

FIG. 4 illustrates an example method 400 for fast data compression for a system with large dynamic range or other system in accordance with this disclosure. For ease of explanation, note that the method 400 may be at least partially performed using the telemetry processor 104 of FIG. 1, which may be implemented using the device 200 of FIG. 2. However, the method 400 may be performed using any suitable device(s) in any suitable system(s).

As shown in FIG. 4, minimum and maximum values of raw data to be received and compressed, as well as a number of bits to be used in compressed data values, are identified at step 402. This may include, for example, identifying the smallest and largest values that might be obtained in raw data. As noted above, the minimum and maximum data values may be set by the hardware, software, or firmware generating or providing the raw data. For ease of discussion below, the minimum and maximum data values that might be obtained in the raw data may be referred to as "global" minimum and maximum data values. This may also include identifying the number of bits to be used in compressed values, which will used to represent the raw data values. The number of bits in the raw data values relative to the number of bits in the compressed data values can define the compression ratio to be used.

A scaling factor that associates raw data values and compressed data values is identified at step 404. This may include, for example, determining a scaling factor based on the global maximum value and the number of bits to be used in the compressed values. In some embodiments, the scaling factor can be determined as follows:

$$\text{Scale} = \frac{2^{(N-1)} - 1}{\log_{10}(MaxValue)} \quad (3)$$

Here, N represents the number of bits to be used in the compressed data values. The scaling factor helps to translate between the different scales of the raw data values and the compressed data values. Note that Equation (3) assumes the global minimum data value is zero. If the global minimum data value is non-zero, the denominator in Equation (3) can compute the logarithm of the difference between the global maximum and global minimum data values.

A compressed value that corresponds to each possible value of the raw data is identified using a distance ratio at step 406. This may include, for example, determining the compressed value that corresponds to each possible value of the raw data, where the possible values of the raw data range from the global minimum value to the global maximum value. The distance ratio defined above in Equation (1) or (2) may be used here to identify the compressed values that correspond to the raw data values. In some embodiments, the compressed value for each possible value of the raw data can be determined as follows:

$$CompressedValue_i = \text{round}\left(Scale \times \log_{10}\left(\frac{i}{MaxValue - i}\right)\right) \quad (4)$$

Here, i represents a raw data value, and $CompressedValue_i$ represents the compressed value associated with the raw data value i. Note that Equation (4) assumes the global minimum data value is zero, so the logarithm involves the ratio defined in Equation (1). If the global minimum data value is non-zero, the logarithm here can involve the ratio defined in Equation (2). Using Equation (4) for all raw data values i ranging from the global minimum value to the global maximum value gives a list of compressed data values to be used to represent the full range of raw data values. The compressed data values here are based on one of the distance ratios described above, allowing the compressed data values to be more accurate for smaller and larger signal values. The minimum and maximum raw data values that correspond to each compressed data value are stored in a lookup table at step 408. This may include, for example, storing a list of the compressed data values and, for each compressed data value, identifying the minimum and maximum raw data values that are mapped to that compressed data value.

At this point, the lookup table can include a range of compressed data values that can be mapped against the full range of possible raw data values in order to compress the raw data. In some embodiments, the lookup table may be placed into use at this point and used as-is to compress raw data.

In other embodiments, the lookup table can be modified to take advantage of unused and under-used values in the lookup table. This can be used to reduce error in a particular region or give greater resolution to a region of interest. To support this, any unused, under-used, and over-used compressed values in the lookup table are identified at step 410. This may include, for example, identifying how many raw data values are mapped to each compressed value in the lookup table and identifying any entries in the lookup table that map to relatively few or relatively more raw data values. The lookup table may be updated to augment the over-used compressed values with the unused or under-used compressed values at step 412. This may include, for example, modifying the lookup table so that the raw data values for the over-used compressed values are distributed over more compressed values, which is done in order to more effectively use the unused or under-used compressed values. Note that this may be limited to only those subranges of the raw data that are of the most interest.

Figure 5A:
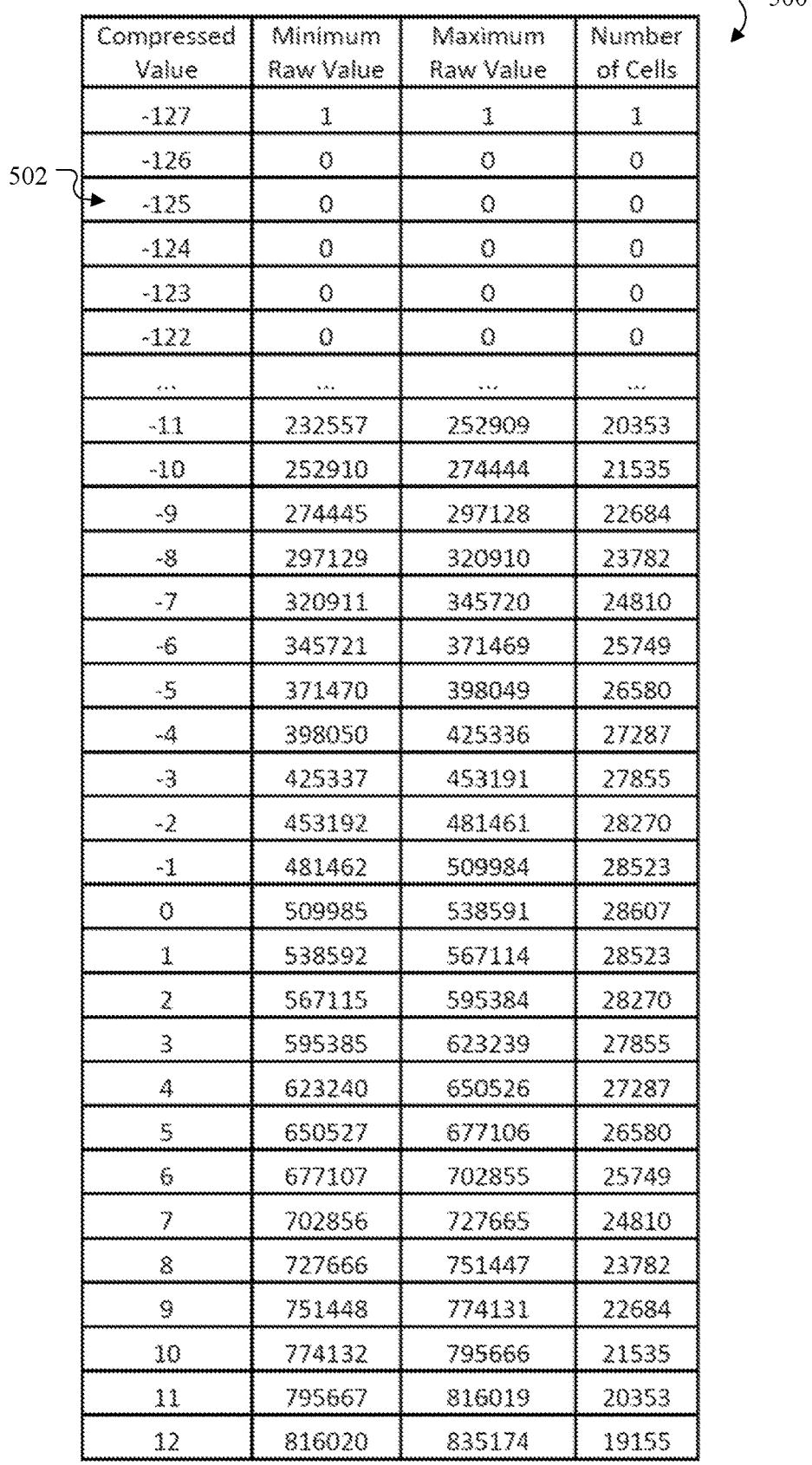
FIGS. 5A and 5B illustrate portions of an example lookup table supporting fast data compression for a system with large dynamic range or other system in accordance with this disclosure.
Figure 5B:
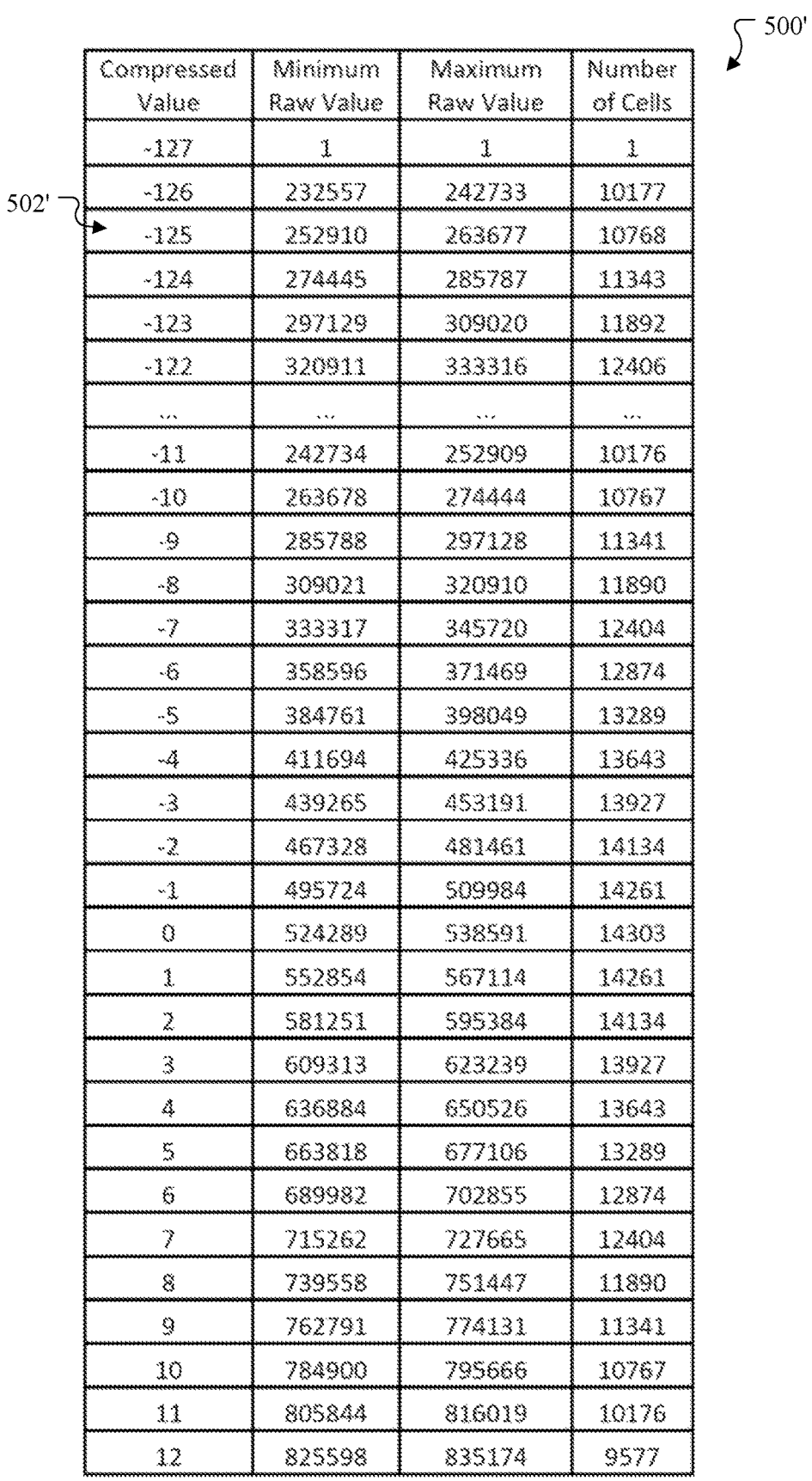

An example of this is shown in FIGS. 5A and 5B, which illustrate portions of an example lookup table supporting fast data compression for a system with large dynamic range or other system in accordance with this disclosure. In particular, FIG. 5A illustrates an example portion of a lookup table 500 after step 408, where each entry 502 of the lookup table 500 identifies a different compressed value and the minimum and maximum raw data value(s) that are mapped to that compressed value. For convenience, each entry 502 of the lookup table 500 also identifies the number of values or "cells" in actual raw data being compressed that fall within the range defined by the minimum and maximum values in that entry 502. In FIG. 5A, some compressed values have been mapped to large numbers of raw data values, while other compressed values have been mapped to a small number of raw data values or to no raw data values. This represents an inefficient use of the compressed data values and can lead to unnecessary errors during compression.

FIG. 5B illustrates an example portion of a lookup table 500' after modification in step 412, where the entries 502' of the table 500' have been updated to change the minimum and maximum raw data values corresponding to at least some of the compressed values. The result is that at least some of the compressed values span smaller ranges of raw data values, and fewer raw data values are mapped to at least some of the compressed values. This can also significantly reduce the number of unused or under-used compressed values. Because of this, there may be even fewer errors in recovered data after decompression.

Once the lookup table is generated at step 408 or modified at step 412, the lookup table can be placed into use during compression operations. For example, actual values of raw data to be compressed are obtained at step 414. This may include, for example, receiving the raw data values to be compressed from the telemetry device 102 at the telemetry processor 104. The original or modified lookup table is accessed to identify the compressed values that correspond to the raw data values at step 418. This may include, for example, identifying the compressed data value from the lookup table that corresponds to each of the raw data values. The identified compressed values from the lookup table are used in place of the raw data values to create a compressed version of the raw data at step 420.

Optionally, the actual range of the raw data values to be compressed can be identified and the raw data values can be remapped at step 416. In these embodiments, the raw data can be remapped to span the full range of possible values between the global minimum and maximum values to account for the fact that the raw data may not always contain the full global range. For example, raw data may potentially have values that span a range from a global minimum of zero to a global maximum of 65,535. However, actual raw data being compressed might range in value from a local minimum of 3,200 to a local maximum of 35,678. If the raw data is logically remapped to span the range defined by the global minimum and maximum values, the entries in the lookup table can be logically scaled. The raw data can be remapped in some embodiments by determining the following:

$$\text{Multiplier} = \frac{MaxValue - 1}{LocalMax - LocalMin} \quad (5)$$

$$ScaledData = \text{round}((Data - LocalMin) \times \text{Multiplier} + 1) \quad (6)$$

Here, LocalMax and LocalMin represent the local maximum and local minimum values actually contained in the raw data being compressed, and Multiplier represents a scaling factor used to rescale the lookup table. Also, Data represents a specific raw data value being compressed, and ScaledData represents a scaled version of the Data value. Note that this assumes the global minimum value is zero, and (if not) the numerator in Equation (5) can be expressed as the difference between the maximum and minimum global values minus one. Essentially, these equations remap the range of the actual raw data values being compressed to span the entire range of the lookup table. The original or modified lookup table can be accessed to identify the compressed values that correspond to the remapped raw data values at step 418, and the identified compressed values from the lookup table are used in place of the raw data values to create a compressed version of the raw data at step 420.

The compressed version of the raw data is output, used, or stored in some manner at step 422. This may include, for example, transmitting the identified compressed values as a stream of data to one or more destinations.

Note that steps 410, 412, and 416 are described above as being optional since the lookup table does not necessarily need to be modified, in which case the original lookup table can be used to compress data. Also, the raw data does not necessarily need to be remapped, in which case the unmapped raw data can be used to access the lookup table and identify compressed values corresponding to the raw data values.

Although FIG. 4 illustrates one example of a method 400 for fast data compression for a system with large dynamic range or other system, various changes may be made to FIG. 4. For example, while shown as a series of steps, various steps in FIG. 4 may overlap, occur in parallel, occur in a different order, or occur any number of times. Also, note that various steps in FIG. 4 may be performed using the same device or using different devices. For instance, a lookup table may be generated on a user device, server, or other device and provided to the telemetry processor 104 for use, or the telemetry processor 104 may be used to generate the lookup table. In addition, note that while the raw data values are described as being logically remapped in step 416, the compressed values in the lookup table may instead be remapped so that the compressed values cover the range of actual raw data being compressed. Although FIGS. 5A and 5B illustrate portions of an example lookup table supporting fast data compression for a system with large dynamic range or other system, various changes may be made to FIGS. 5A and 5B. For instance, the actual contents of the lookup tables, as well as the modifications made to the lookup tables, may vary as needed as desired.

Note that decompression of compressed data may occur in an opposite manner as the compression. Thus, for example, a compressed data value can be used to access a lookup table and identify a range of raw data values corresponding to the compressed data value. The lookup table may or may not be scaled so that the compressed values in the lookup table span the actual values of the raw data. When the data is scaled, the local minimum and maximum values are included with the compressed data for raw data value recovery. Suitable post-processing, such as filtering or smoothing, can be applied to the recovered raw data values in order to finalize the decompression.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   defining a lookup table comprising multiple compressed data values and, for each compressed data value, a range of one or more raw data values associated with the compressed data value; and
   compressing raw data using the lookup table;
   wherein each raw data value is associated with one of the compressed data values in the lookup table based on a distance ratio involving (i) a distance of the raw data value from a minimum value and (ii) a distance of the raw data value from a maximum value.

2. The method of claim 1, wherein, for each raw data value, the distance ratio involves (i) a distance of the raw data value from a global minimum value identifying a smallest possible value of the raw data and (ii) a distance of the raw data value from a global maximum value identifying a largest possible value of the raw data.

3. The method of claim 2, wherein:
   the raw data being compressed spans a range from a local minimum value to a local maximum value, the range not extending from the global minimum value to the global maximum value; and
   the method further comprises remapping at least one of the raw data and the lookup table so that an increased number of compressed values in the lookup table span the range from the local minimum value to the local maximum value.

4. The method of claim 1, wherein each raw data value is associated with one of the compressed data values in the lookup table based on a logarithm of the distance ratio.

5. The method of claim 1, wherein the raw data values are associated with the compressed data values in the lookup table such that multiple subregions in a range of raw data values are associated with more compressed data values and at least one subregion in the range of raw data values is associated with fewer compressed data values.

6. The method of claim 5, wherein the multiple subregions in the range of raw data values associated with more compressed data values comprise:
   a first sub-region at a lower end of the range of raw data values; and
   a second sub-region at a higher end of the range of raw data values.

7. The method of claim 1, further comprising:
   outputting, using, or storing the compressed data.

8. An apparatus comprising:
   at least one memory configured to store a lookup table comprising multiple compressed data values and, for each compressed data value, a range of one or more raw data values associated with the compressed data value; and
   at least one processor configured to compress raw data using the lookup table;
   wherein each raw data value is associated with one of the compressed data values in the lookup table based on a distance ratio involving (i) a distance of the raw data value from a minimum value and (ii) a distance of the raw data value from a maximum value.

9. The apparatus of claim 8, wherein, for each raw data value, the distance ratio involves (i) a distance of the raw data value from a global minimum value identifying a smallest possible value of the raw data and (ii) a distance of the raw data value from a global maximum value identifying a largest possible value of the raw data.

10. The apparatus of claim 9, wherein:
    the raw data being compressed spans a range from a local minimum value to a local maximum value, the range not extending from the global minimum value to the global maximum value; and
    the at least one processor is configured to remap at least one of the raw data and the lookup table so that an increased number of compressed values in the lookup table span the range from the local minimum value to the local maximum value.

11. The apparatus of claim 8, wherein each raw data value is associated with one of the compressed data values in the lookup table based on a logarithm of the distance ratio.

12. The apparatus of claim 8, wherein the raw data values are associated with the compressed data values in the lookup table such that multiple subregions in a range of raw data values are associated with more compressed data values and at least one subregion in the range of raw data values is associated with fewer compressed data values.

13. The apparatus of claim 12, wherein the multiple subregions in the range of raw data values associated with more compressed data values comprise:
    a first sub-region at a lower end of the range of raw data values; and
    a second sub-region at a higher end of the range of raw data values.

14. The apparatus of claim 8, wherein the at least one processor is further configured to output, use, or store the compressed data.

15. A non-transitory computer readable medium containing instructions that when executed cause at least one processor to:
    access a lookup table comprising multiple compressed data values and, for each compressed data value, a range of one or more raw data values associated with the compressed data value; and
    compress raw data using the lookup table;
    wherein each raw data value is associated with one of the compressed data values in the lookup table based on a distance ratio involving (i) a distance of the raw data value from a minimum value and (ii) a distance of the raw data value from a maximum value.

16. The non-transitory computer readable medium of claim 15, wherein, for each raw data value, the distance ratio involves (i) a distance of the raw data value from a global minimum value identifying a smallest possible value of the raw data and (ii) a distance of the raw data value from a global maximum value identifying a largest possible value of the raw data.

17. The non-transitory computer readable medium of claim 16, wherein:
    the raw data being compressed spans a range from a local minimum value to a local maximum value, the range not extending from the global minimum value to the global maximum value; and
    further containing instructions that when executed cause the at least one processor to remap at least one of the raw data and the lookup table so that an increased number of compressed values in the lookup table span the range from the local minimum value to the local maximum value.

18. The non-transitory computer readable medium of claim 15, wherein each raw data value is associated with one of the compressed data values in the lookup table based on a logarithm of the distance ratio.

19. The non-transitory computer readable medium of claim 15, wherein the raw data values are associated with the compressed data values in the lookup table such that multiple subregions in a range of raw data values are associated with more compressed data values and at least one subregion in the range of raw data values is associated with fewer compressed data values.

20. The non-transitory computer readable medium of claim 19, wherein the multiple subregions in the range of raw data values associated with more compressed data values comprise:
- a first sub-region at a lower end of the range of raw data values; and
- a second sub-region at a higher end of the range of raw data values.

* * * * *